(12) United States Patent
Chabas

(10) Patent No.: US 6,292,055 B1
(45) Date of Patent: Sep. 18, 2001

(54) ELECTRONIC APPARATUS COMPRISING A POWER AMPLIFIER

(75) Inventor: Jean A. Chabas, Cesson Sevigne (FR)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/510,161

(22) Filed: Feb. 22, 2000

(30) Foreign Application Priority Data

Feb. 26, 1999 (FR) .................................................. 9902455

(51) Int. Cl.[7] .................................................. H03F 1/26
(52) U.S. Cl. ........................ 330/149; 330/124 R; 375/297
(58) Field of Search ............................... 330/149, 124 R; 375/297

(56) References Cited

U.S. PATENT DOCUMENTS 5,043,673 * 8/1991 Suematsu et al. .................... 330/149
5,151,664 * 9/1992 Suematsu et al. .................... 330/149
5,774,018 * 6/1998 Gianfortune et al. ................. 330/52
6,037,837 * 3/2000 Miyaji et al. ........................ 330/149

OTHER PUBLICATIONS

Rodrigo Cordeiro Tupynamba et al: "Mesfet Nonlinearities Applied to Predistortion Linearizer Design" International Microwave Symposium Digest (MTT–S), Albuquerque, Jun. 1–5, 1992, vol. 2, pp. 955–957 Figure 2.
Patent Abstract of Japan: Publication No.: 08125554 A, Date of Publication: May 17, 1996.

* cited by examiner

Primary Examiner—Robert Pascal
Assistant Examiner—Henry Choe
(74) Attorney, Agent, or Firm—Jack D. Slobod

(57) ABSTRACT

This electronic apparatus comprises a power amplifier formed by an output stage (21) that has a non-linear amplification characteristic, and a correction assembly (60, 46) for compensating for the non-linearities of said characteristic. This assembly is formed by a low-power preamplifier (46) of the same type as said power stage, consequently presenting the same non-linearity as stage (21). The combining device (60) combining the signals applied to the input terminal (25) with the output signals of said preamplifier (25) largely counteracts the non-linearities of said characteristics.

7 Claims, 1 Drawing Sheet

ELECTRONIC APPARATUS COMPRISING A POWER AMPLIFIER

BACKGROUND OF THE INVENTION

The present invention relates to an electronic apparatus comprising a power amplifier formed by:
- an output stage having a non-linear amplification characteristic,
- a correction assembly for compensating for the non-linearities of said characteristic.

The invention also relates to an amplifier suitable for such an apparatus.

The invention finds applications in mobile radiotelephony devices for which the requirements of the transmitter are demanding as regards the purity of the spectrum of the transmitted signals. This necessitates, inter alia, that the output amplifier working at high frequency has a very good amplification linearity.

Patent document of Japan published under no. 08125554 describes such an amplifier. To obtain a proper linearity, various means are provided forming a rather complex structure.

SUMMARY OF THE INVENTION

The present invention proposes an apparatus of the type defined in the opening paragraph that presents a simpler structure.

Therefore, such an apparatus is characterized in that the correction assembly comprises:
- a low-power preamplifier of the same type as said power stage,
- a combining device for combining the input signals with the output signals of said preamplifier to counteract the non-linearities of said characteristics.

The idea of the invention is that when the amplifiers are integrated on the same chip, the characteristics are similar whatever the power of the amplifiers, this power in fact depending on the surface occupied by the output transistors.

BRIEF DESCRIPTION OF THE DRAWINGS

These and other aspects of the invention are apparent from and will be elucidated, by way of non-limitative example, with reference to the embodiment(s) described hereinafter.

In the drawings.

DETAILED DESCRIPTION OF THE PREFERRED EMBODIMENT

Figure 1:
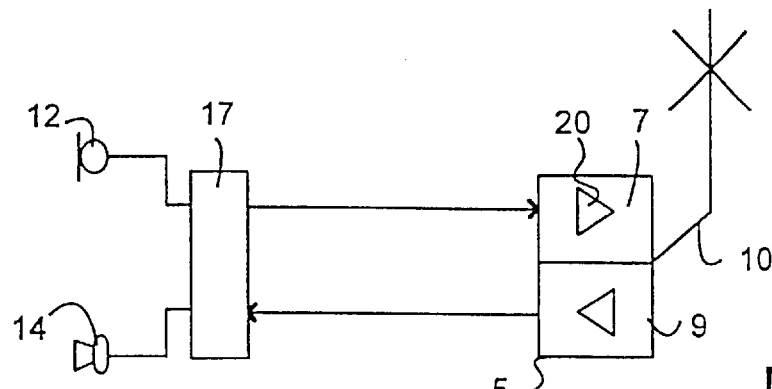
FIG. 1 shows an apparatus in accordance with the invention.

In FIG. 1 is represented an electronic apparatus in accordance with the invention. This apparatus is a transmitter/receiver such a mobile radio in a cellular network. It is formed by a transmission/reception assembly 5 which comprises a transmission part 7 and a reception part 9 for transmitting signals and for receiving signals while use is made of an antenna 10. The signals to be transmitted notably come from a microphone 12 and those which are received are notably intended for an earphone 14. A processing element 17 ensures the interface between the low-frequency signals with respect to the microphone 12 and the earphone 14 in the assembly 5.

The transceiver assembly comprises a high-frequency amplifier 20 producing relatively powerful signals.

Figure 2:
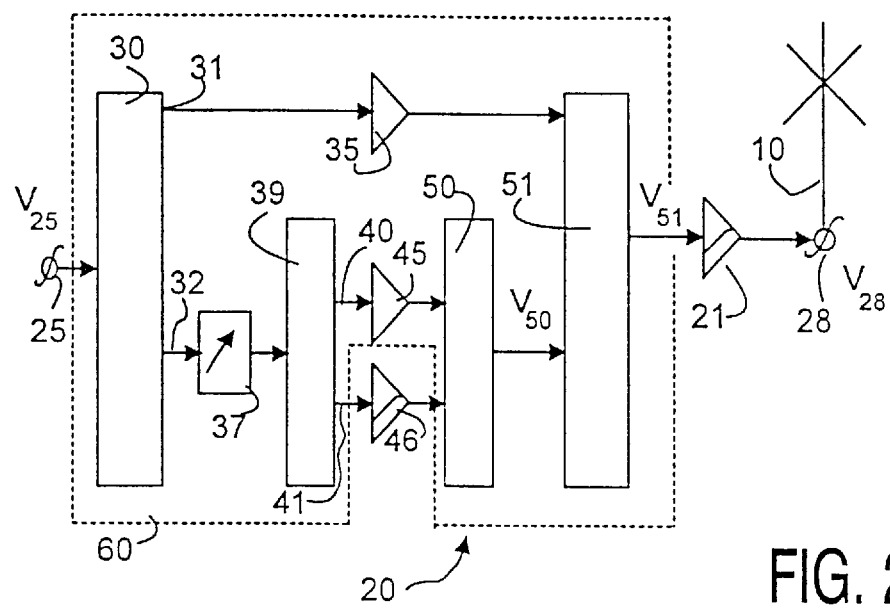
FIG. 2 shows the manufacturing diagram of the amplifier of the apparatus shown in FIG. 1.

This amplifier 20 is shown in detail in FIG. 2. It is formed, in essence, by a high-frequency stage 21. This amplifier 20 comprises an input terminal 25 and an output terminal 28 which is connected to the antenna 10. The input terminal 25 is connected to a power divider 30 which produces two signals having the same phase on the outputs 31 and 32. The output 31 is connected to a first amplifier 35 and the output 32 to the inputs of a level and phase adjuster 37 whose output is connected to the input of a phase shifter 39. This adjuster 37 enables to better adjust the electrical dispersions of the various elements forming the amplifier according to the invention. This adjuster produces on its two outputs 40 and 41 two signals of which one is in-phase with that of the input signal and the other in phase opposition thereto. The latter two signals are applied to the inputs of two preamplifiers 45 and 46. The output signals of the amplifiers 35, 45 and 46 are subtracted/added respectively, by the subtracter circuit 50 and by the adder circuit 51. The output signal of the circuit 50 represents a distortion that has accordingly been extracted. The output signal of the circuit 51 is a predistortion signal to be applied to stage 21.

Figure 3:
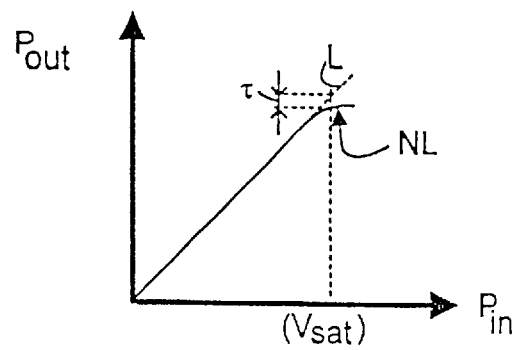
FIG. 3 shows a transfer curve of an amplifier that has a non-linearity.

The amplifier 21 has a non-linear transfer function as is represented in FIG. 3. This non-linearity notably occurs the moment the input level exceeds a certain value $V_{sat}$ which defines a certain distortion rate τ, for example, the difference of the linear characteristic L and the non-linear part:

$$\tau = \frac{L - NL}{L}$$

According to the invention, the amplifier 46 is also to have this non-linearity whereas the other amplifiers 35 and 45 are considered perfect. They are combined with the other elements to form a combining device 60.

The operation of such an amplifier is based on the following considerations.

FIG. 3 shows a non-linear amplification characteristic which represents the output power $<<P_{out}>>$ as a function of the input power $<<P_{in}>>$. The non-linearity NL occurs for high-amplitude signals.

If one considers the voltage gain of the amplifiers 35 and 45, there may be written:

$$V_{out} = A \, V_{in}$$

The voltage gain of the amplifiers 46 and 21 is described, respectively, by looking only at the first terms of a limited development so as to take non-linearities $$V_{out} = A \cdot V_{in} - \alpha V_{in}^2$$

$$V_{out} = k(A \cdot V_{in} - \alpha V_{in}^2) \text{ into account,}$$

where A is the gain of the amplifier 46 and kA the gain of the amplifier 21, and α represents the saturation of these amplifiers, which saturation induces the non-linearities.

If the signal on the input of the amplifier 20 is called $V_{25}$, the subtracter circuit 50 thus produces a signal $V_{50}$:

$$V_{50} = A \, V_{25} - (A \cdot V_{25} - \alpha V_{25}^2) = +\alpha V_{25}^2.$$

On the output of the adder circuit 51 there is a voltage $V_{51}$:

$$V_{51} = A \cdot V_{25} + \alpha V_{25}^2.$$

On the output 28 of the amplifier 21, the voltage $V_{28}$ is written as:

$$V_{28} = k(A \cdot V_{51} - \alpha V_{51}^2).$$

Expressing this in detail, there is obtained:

$$V_{28}/k = A(A \cdot V_{25} + \alpha V_{25}^2) - \alpha(A \cdot V_{25} - \alpha V_{25}^2)^2$$

$$V_{28}/k = A^2 \cdot V_{25} + \alpha \cdot A (1-A) \cdot V_{25}^2 - 2 \cdot A \cdot \alpha^2 \cdot V_{25}^3 - \alpha^3 \alpha V_{25}^4.$$

Accordingly, the contribution of the non-linearities has diminished well if A is given a value close to 1 and by considering that the terms $V_{25}^3$ and $V_{25}^4$ lead only to a negligible contribution for reasonable non-linearities.

What is claimed is:

1. An amplifier assembly having an input signal and an output signal, the amplifier assembly comprising:
   an output stage amplifier having a non-linear characteristic;
   a reference stage amplifier having a non-linear characteristic at least essentially identical to the non-linear characteristic of the output stage amplifier; and a correction assembly, coupled to an input of the output stage amplifier that compensates for the non-linearity of the characteristic of the output stage amplifier by combining the input signal with an output of the reference stage amplifier so as to counteract the non-linearity of the output stage characteristic; wherein the correction assembly comprises:
   a preamplifier;
   a distortion extractor that receives, as inputs, the output of the preamplifier and the output of the reference stage amplifier, wherein the distortion extractor outputs a distortion signal representative of the non-linear characteristic of the output stage amplifier; and
   a precorrection device, having (i) an input coupled to the output of the distortion extractor and (ii) an output coupled to an input of the output stage amplifier, for producing a combined signal comprising the distortion signal and the input signal, wherein the combined signal is provided as an input to the output stage amplifier;
   whereby the combined effect of the correction assembly and the reference stage amplifier at least essentially counteracts the non-linearity of the characteristic of the output stage amplifier.

2. The amplifier assembly as claimed in claim 1, wherein the non-linear characteristic of the output stage amplifier is an amplification characteristic.

3. The amplifier assembly as claimed in claim 1, wherein the reference stage amplifier and the output stage amplifier are disposed on the same semiconductor surface.

4. An electronic device comprising:
   an amplifier assembly, wherein the amplifier assembly comprises:
      an output stage amplifier having a non-linear characteristic;
      a reference stage amplifier having a non-linear characteristic at least essentially identical to the non-linear characteristic of the output stage amplifier; and a correction assembly,-coupled to an input of the output stage amplifier, that compensates for the non-linearity of the characteristic of the output stage amplifier by combining an input signal to the amplifier assembly with an output of the reference stage amplifier so as to counteract the non-linearity of the output stage characteristic; wherein the correction assembly comprises.
      a preamplifier;
      a distortion extractor that receives, as inputs, the output of the preamplifier and the output of the reference stage amplifier, wherein the distortion extractor outputs a distortion signal representative of the non-linear characteristic of the output stage amplifier; and
      a precorrection device, having (i) an input coupled to the output of the distortion extractor and (ii) an output coupled to an input of the output stage amplifier, for producing a combined signal comprising the distortion signal and the input signals wherein the combined signal is provided as an input to the output stage amplifier; whereby the combined effect of the correction assembly and the reference stage amplifier at least essentially counteracts the non-linearity of the characteristic of the output stage amplifier.

5. An amplifier assembly having an input signal and an output signal, the amplifier assembly comprising:
   an output stage amplifier having a non-linear characteristic;
   a reference stage amplifier having a non-linear characteristic at least essentially identical to the non-linear characteristic of the output stage amplifier; and
   a correction assembly, coupled to an input of the output stage amplifier, that compensates for the non-linearity of the characteristic of the output stage amplifier, wherein the correction assembly comprises:
   circuitry that receives as an input the input signal and outputs at least a first phase signal and a second phase signal;
   a preamplifier that receives as an input the first phase signal, wherein the second phase signal is inputted to the reference stage amplifier;
   a distortion extractor that receives, as inputs, the output of the preamplifier and the output of the reference stage amplifier, wherein the distortion extractor outputs a distortion signal representative of the non-linear characteristic of the output stage amplifier; and
   a precorrection device, having (i) an input coupled to the output of the distortion extractor and (ii) an output coupled to an input of the output stage amplifier, for producing a combined signal comprising the distortion signal and the input signal, wherein the combined signal is provided as an input to the output stage amplifier;
   whereby the combined effect of the correction assembly and the reference stage amplifier at least essentially counteracts the non-linearity of the characteristic of the output stage amplifier.

6. The amplifier assembly as claimed in claim 5, wherein the non-linear characteristic of the output stage amplifier is an amplification characteristic.

7. The amplifier assembly as claimed in claim 5, wherein the reference stage amplifier and the output stage amplifier are disposed on the same semiconductor surface.

* * * * *